US008823060B1

(12) United States Patent
Colinge et al.

(10) Patent No.: US 8,823,060 B1
(45) Date of Patent: Sep. 2, 2014

(54) METHOD FOR INDUCING STRAIN IN FINFET CHANNELS

(71) Applicant: Taiwan Semiconductor Manufacturing Co., Ltd., Hsin-Chu (TW)

(72) Inventors: Jean-Pierre Colinge, Hsinchu (TW); Kuo-Cheng Ching, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/771,249

(22) Filed: Feb. 20, 2013

(51) Int. Cl.
H01L 29/66 (2006.01)
H01L 29/78 (2006.01)

(52) U.S. Cl.
CPC ...... *H01L 29/7843* (2013.01); *H01L 29/66795* (2013.01); *H01L 29/7848* (2013.01)
USPC .......................................................... 257/192

(58) Field of Classification Search
USPC .......................................................... 257/192
See application file for complete search history.

(56) References Cited

U.S. PATENT DOCUMENTS

| | | | | |
|---|---|---|---|---|
| 6,803,631 | B2* | 10/2004 | Dakshina-Murthy et al. | 257/349 |
| 6,958,512 | B1* | 10/2005 | Wu et al. | 257/315 |
| 7,074,623 | B2* | 7/2006 | Lochtefeld et al. | 438/3 |
| 8,048,723 | B2* | 11/2011 | Chang et al. | 438/135 |
| 8,263,462 | B2* | 9/2012 | Hung et al. | 438/286 |
| 8,455,307 | B2* | 6/2013 | Cho | 438/142 |
| 2006/0284255 | A1* | 12/2006 | Shin et al. | 257/351 |
| 2007/0020833 | A1* | 1/2007 | Mears et al. | 438/197 |
| 2007/0020860 | A1* | 1/2007 | Mears et al. | 438/285 |
| 2007/0085140 | A1* | 4/2007 | Bassin | 257/353 |
| 2009/0206410 | A1* | 8/2009 | Mitani | 257/368 |
| 2010/0144121 | A1* | 6/2010 | Chang et al. | 438/478 |
| 2010/0163971 | A1* | 7/2010 | Hung et al. | 257/327 |
| 2011/0171795 | A1 | 7/2011 | Tsai et al. | |
| 2011/0193141 | A1 | 8/2011 | Lin et al. | |
| 2011/0210393 | A1 | 9/2011 | Chen et al. | |
| 2011/0248322 | A1* | 10/2011 | Wong et al. | 257/288 |
| 2012/0061649 | A1* | 3/2012 | Datta et al. | 257/24 |
| 2012/0292672 | A1* | 11/2012 | Cho | 257/288 |
| 2013/0043507 | A1* | 2/2013 | Wu et al. | 257/192 |
| 2013/0264617 | A1* | 10/2013 | Joshi et al. | 257/288 |
| 2013/0270513 | A1* | 10/2013 | Romero et al. | 257/9 |
| 2013/0302956 | A1* | 11/2013 | Flachowsky et al. | 438/231 |
| 2014/0008734 | A1* | 1/2014 | Lu | 257/401 |
| 2014/0054648 | A1* | 2/2014 | Itokawa et al. | 257/192 |
| 2014/0054650 | A1* | 2/2014 | Colinge | 257/192 |
| 2014/0061815 | A1* | 3/2014 | Jagannathan | 257/369 |
| 2014/0097487 | A1* | 4/2014 | Yen et al. | 257/327 |

OTHER PUBLICATIONS

U.S. Appl. No. 13/795,786, filed Mar. 12, 2013 with USPTO.

* cited by examiner

*Primary Examiner* — Yu-Hsi D Sun
*Assistant Examiner* — Grant Withers
(74) *Attorney, Agent, or Firm* — Eschweiler & Associates, LLC

(57) ABSTRACT

FinFETs in which a swelled material within the fin, typically an oxide of the fin semiconductor, causes strain that significantly increases charge carrier mobility within the FinFET channel. The concept can be applied to either p-type or n-type FinFETs. For p-type FinFETs the swelled material is positioned underneath the source and drain regions. For n-type FinFETs the swelled material is positioned underneath the channel region. The swelled material can be used with or without strain-inducing epitaxy on the source and drain areas and can provide greater strain than is achievable by strain-inducing epitaxy alone.

19 Claims, 18 Drawing Sheets

METHOD FOR INDUCING STRAIN IN FINFET CHANNELS

FIELD OF THE INVENTION

The present disclosure relates to FinFETs for integrated circuit devices and methods of manufacturing them.

BACKGROUND

The semiconductor industry's drive for higher device densities, better device performance, and lower cost has led to the development of integrated circuit transistors that are three-dimensional in the sense of making greater use of space perpendicular to the substrate surface. One such transistor is the multigate field-effect transistor, aka MuGFET, trigate FET, gate-all-around FET, pi-gate FET, omega-gate FET or FinFET. The name "FinFET" as used herein refers to all of these devices. A FinFET is a field effect transistor (FET) having a channel formed in a fin-like structure of semiconductor extending from a substrate surface. This channel geometry allows the gate to wrap around one or more sides of the channel and/or act on the channel from its sides. This improves control over the channel and reduces short channel effects in comparison to a more conventional structure in which a single plane separates the channel from its gate. The fin-like structure also allows the channel to be extended vertically, increasing its cross-sectional area and permitting a higher current without increasing the transistor's footprint.

Another way to permit a transistor to support a higher current without increasing its footprint is to induce strain in the channel. A compressive strain increases charge carrier mobility in a p-type metal oxide semiconductor field effect transistor (pMOS) channel and a tensile strain increases charge carrier mobility in an n-type metal oxide semiconductor field effect transistor (nMOS). Channel strain is typically induced by forming trenches in the source and drain regions adjacent the channel and epitaxially growing within the trenches a semiconductor having a lattice constant different from that of the channel. SiGe has a larger lattice constant than silicon and can be grown in the source and drain regions to induce compressive strain for silicon-based pMOS devices. SiP or SiC has a smaller lattice constant than silicon and can be grown in the source and drain regions to induce tensile strain for silicon-based nMOS devices.

DETAILED DESCRIPTION

The present disclosure provides integrated circuit devices in which a swelled material, typically an oxide, within a FinFET fin causes strain that significantly increases charge carrier mobility within the FinFET channel. The concept can be applied to either p-type or n-type FinFETs. For p-type FinFETs the swelled material is positioned underneath the source and drain regions. For n-type FinFETs the swelled material is positioned underneath the channel region. The swelled material can be used with or without strain-inducing epitaxy on the source and drain areas and can provide greater strain than is achievable by strain-inducing epitaxy alone.

Stress on a solid material necessarily results in strain. The strain resulting from stress that reaches at least 0.5 GPa in any one direction at some point within the channel is generally sufficient to provide a significant increase in charge carrier mobility, provided the strain is compressive for a p-type FinFET and tensile for an n-type FinFET. These stresses correspond approximately to a 0.5% change in the distance between atomic planes, a distance that can be determined using high-resolution transmission electron microscopy (TEM).

Figure 1:
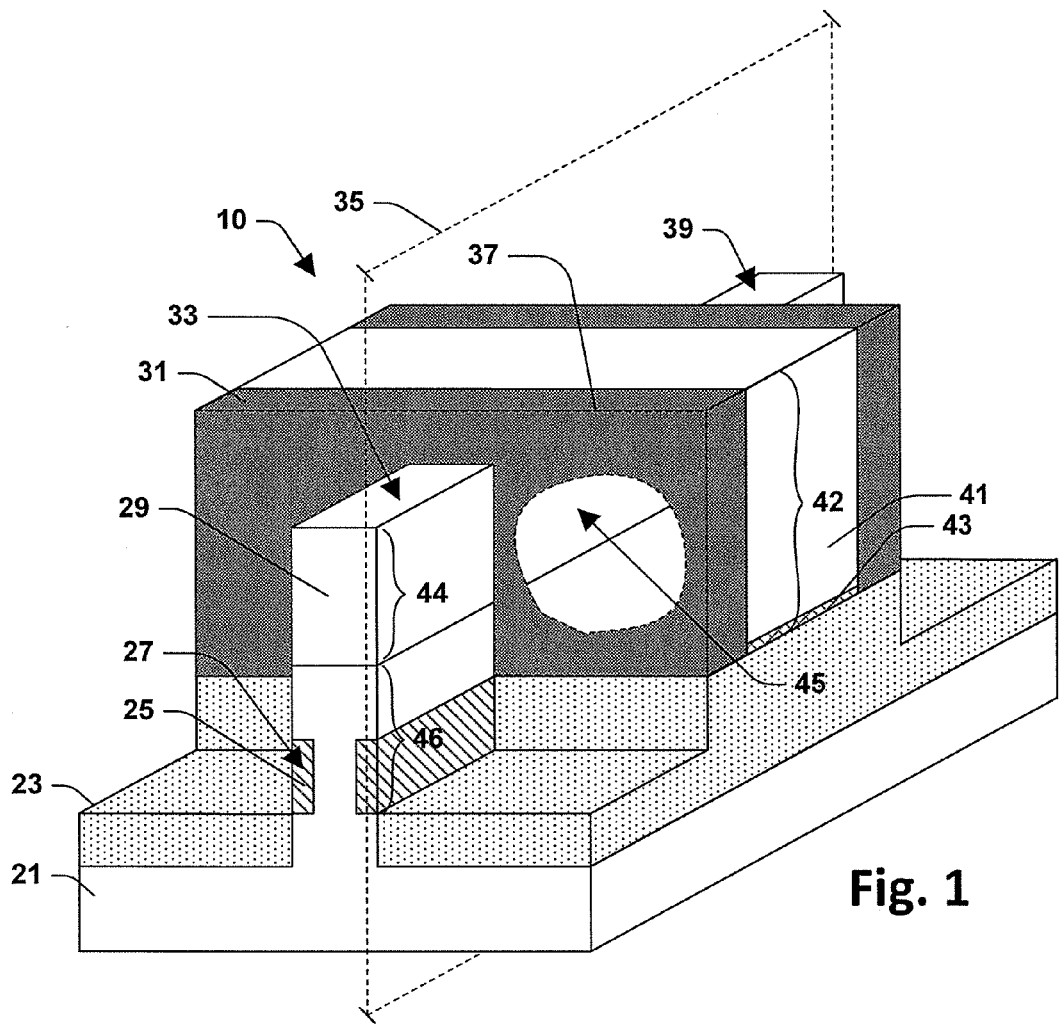
FIG. 1 illustrates an example p-type FinFET according to one embodiment provided by the present disclosure.
Figure 3:
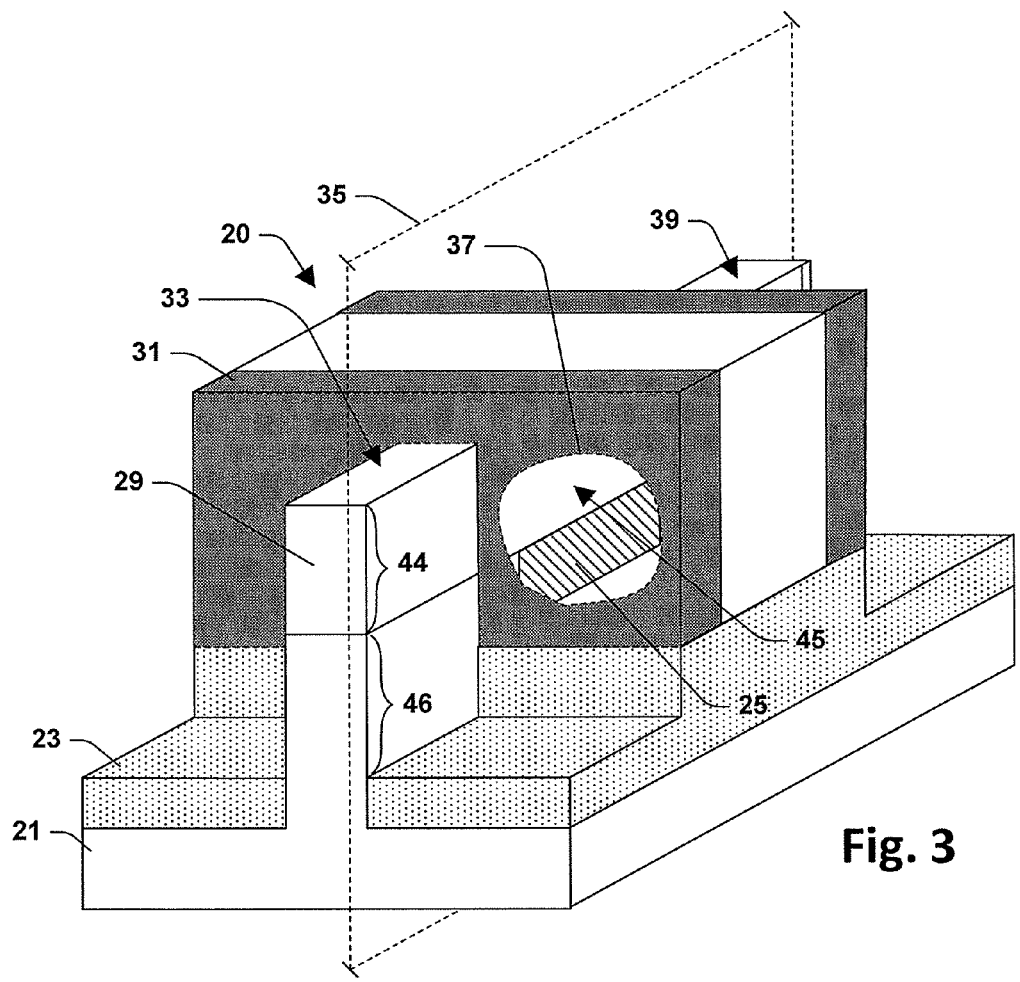
FIG. 3 is a view of a cross section of the example shown in FIG. 2 taken along the plane 35 and illustrates an example n-type FinFET provided by the present disclosure according to one embodiment.

FIG. 1 provides an example of a p-type FinFET 10 provided by the present disclosure according to one embodiment. FIG. 3 provides an example of a n-type FinFET 20 according to one embodiment. These two examples include many of the same elements. The description of elements included in p-type FinFET 10 generally applies to like numbered elements of n-type FinFET 20 except where differences are noted. A single integrated circuit device can contain many of either or both types of FinFETs. In one embodiment, an integrated circuit device contains p-type FinFETs 10 and n-type FinFETs 20, both having stress-inducing swelled material as described herein.

The FinFET 10 include a semiconductor fin 29 on a semiconductor 21. The fin 29 includes a source region 33 at one end, a drain region 39 at the other end, and a channel region 45 in between. These regions are in an upper portion 44 of the fin 29. A gate 42 wraps around the channel region 45. FIG. 1 includes a cutaway 37 in which gate 42 and spacer 31 have been removed from the view to reveal part of the channel region 45 of the fin 29. The gate 42 includes a dielectric layer 43 and a conductive layer 41. Spacers 31 are formed to either side of the gate 42.

A swelled material 25 is positioned within regions 27 in a lower portion 46 of the fin 29. An upper portion 44 of the fin 29 overhangs the regions 27. In the p-type FinFET 10, the swelled material 25 is positioned under the source region 33 and the drain region 39 of the fin 29, but is not present under the channel region 45. As shown in FIG. 3, for the n-type FinFET 20 the situation is reversed in that the swelled material 25 is positioned under the channel region 45 but not under the source region 33 or the drain region 39.

Figure 2:
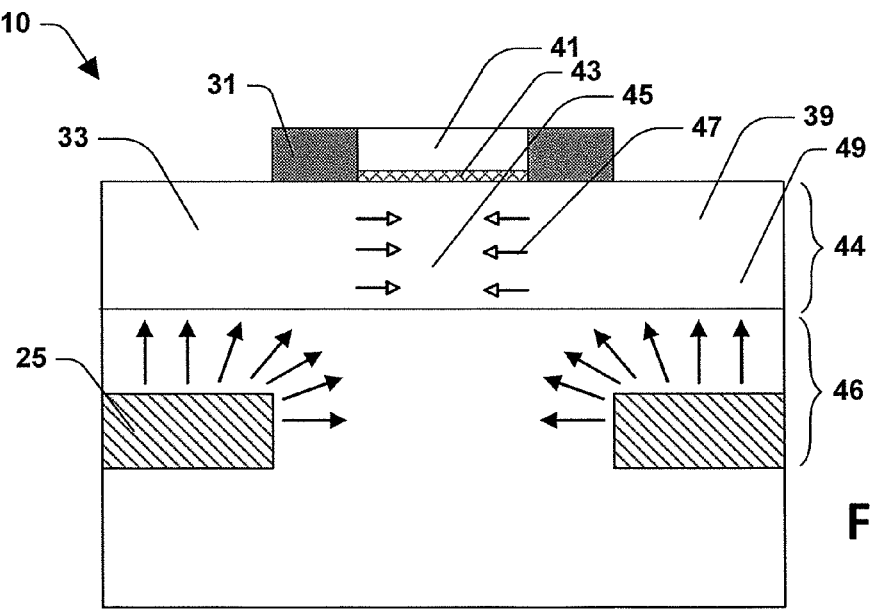
FIG. 2 is a view of a cross section of the example shown in FIG. 1 taken along the plane 35 and illustrates the stresses and strains caused by the swelled material in the example p-type FinFET according to one embodiment.

FIG. 2 illustrates the stresses 49 and the resulting strains 47 caused by the swelled material 25 underneath the source region 33 and drain region 39 of the p-type FinFET 10. The p-type FinFET 10 is generally one element in an array of like elements, which is why the direction of the stresses 49 becomes vertical at the left and right limits of the view provided in FIG. 2. The resulting strains 47 are compressive in the channel region 45 of the p-type FinFET 10.

Figure 4:
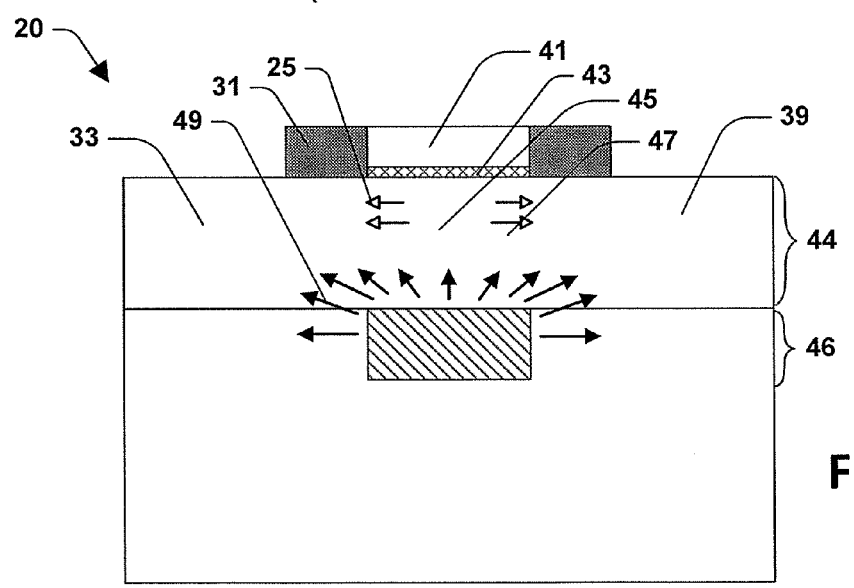
FIG. 4 illustrates the stresses and strains caused by the swelled material in the example n-type FinFET according to one embodiment.

FIG. 4 illustrates the stresses 49 and the resulting strains 47 caused by the swelled material 25 underneath the channel region 45 of the n-type FinFET 20 according to one embodiment. The stresses 49 produced by the swelled material 25 in the n-type FinFET 20 are upward into the channel region 45 and outward. The upward stresses are partially relieved by upward deformation (not shown) of the channel region 45. The overall effect is that the stresses 47 in the channel region 45 of the n-type FinFET 20 are tensile.

A swelled material is one having undergone a chemical transformation subsequent to its emplacement, the chemical transformation being one that causes expansion. A swelled material in an integrated circuit device structure can be identified by its physical effect on surrounding structures and by a chemical composition consistent with the material having been swelled. In general, in one embodiment the swelled material is an oxidized form of a semiconductor and the chemical transformation is an oxidation reaction.

The present disclosure also provides a method of inducing strain in a FinFET's channel. The upper portion of the fin is masked through the entire fin length. A lower portion of the fin is also masked, but only through a first portion of the fin length that is less than the entire length of the fin. The lower portion of the fin is left exposed through a second portion of the fin length. The fin is oxidized where it is exposed. The oxidation produces an expansion of material within a portion of the fin that is within the second portion of the fin length and under the upper portion of the fin. The oxidation and resulting expansion proceeds to a degree that causes strain in the channel, the strain being sufficient to cause a significant increase in charge carrier mobility within the channel.

Figure 5:
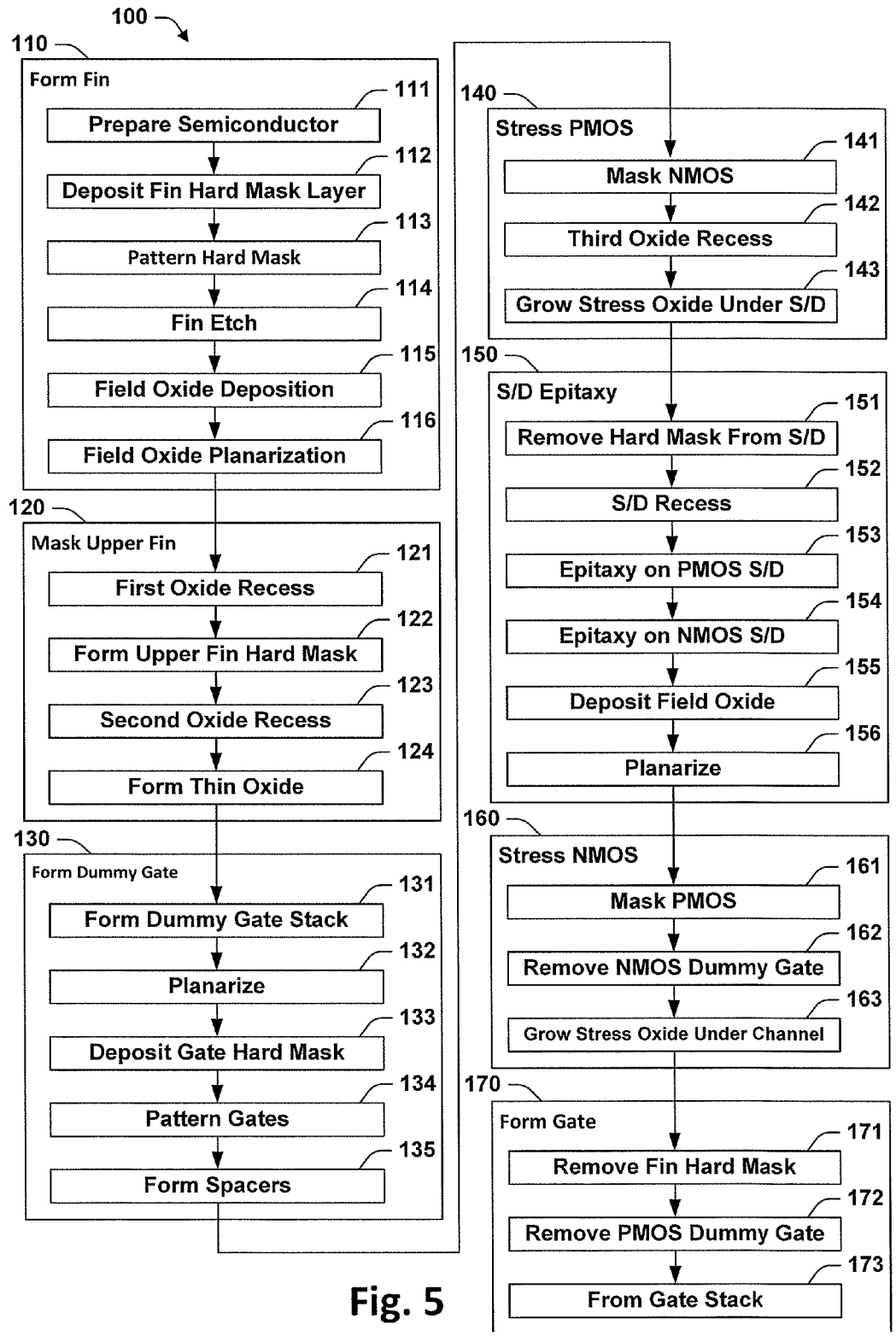
FIG. 5 is a flow chart of an example process according to one embodiment provided by the present disclosure.

FIG. 5 is a flow chart of an example process 100 that can be used to form an integrated circuit device that has p-type FinFETs 10 in pMOS regions and n-type FinFETs 20 in nMOS regions. The portions of the process 100 that produce the p-type FinFETs 10 can be used separately from the portions of the process 100 that produce the n-type FinFETs 20. However, many of the acts that produce the p-type FinFETs 10 are the same as the acts that produce the n-type FinFETs 20. In the following description, acts that are illustrated in terms of how they form the p-type FinFETs 10 are also applied to forming the n-type FinFETs 20 except as an optional alternative or where differences between the treatment of p-type and n-type FinFETs are noted.

The process 100 begins with a series of acts 110 that form the fin 29. The first act 111 is providing and preparing the semiconductor 21. Preparing the semiconductor 21 can include doping to provide separate n-doped and p-doped regions of the semiconductor 21 for the p-type FinFETs 10 and n-type FinFETs 20 respectively.

The semiconductor 21 can have any suitable composition. Examples of semiconductors that can be suitable include, without limitation, Si, Ge, SiC, GaAs, GaAlAs, InP, GaN, or other II-V compound semiconductors and SiGe. The semiconductor substrate 21 can be provided on any suitable substrate. A suitable substrate can be, for example, a single crystal semiconductor wafer or semiconductor on insulator (SOI) structure.

Figure 7:
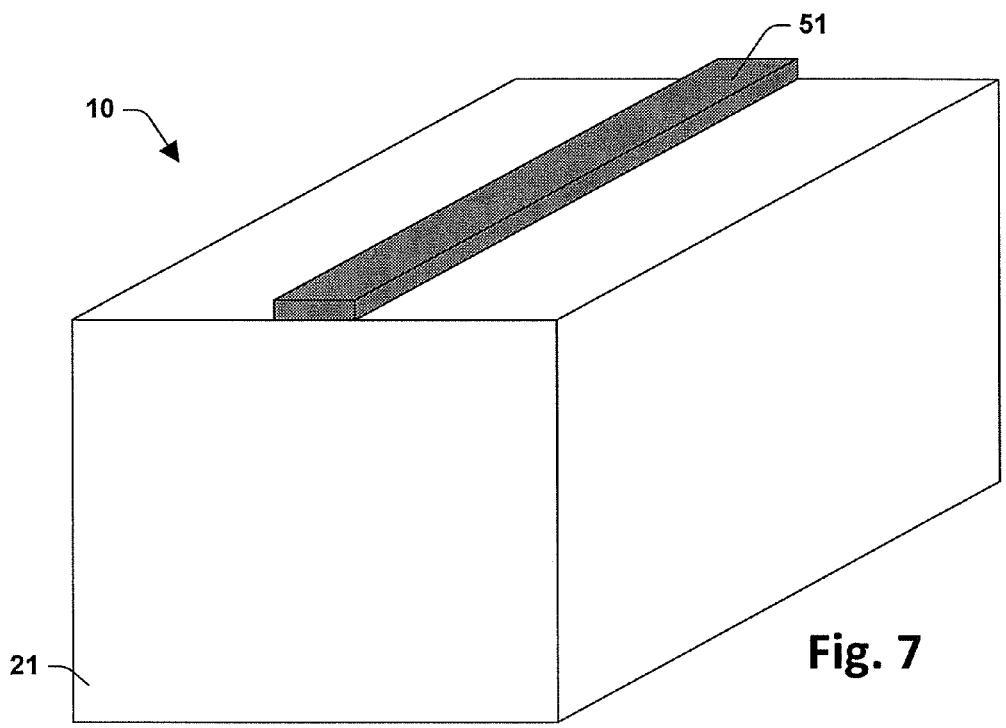
FIGS. 7-32 illustrate p-type and n-type FinFETs as they undergo manufacture by the example processes according to one embodiment.
Figure 8:
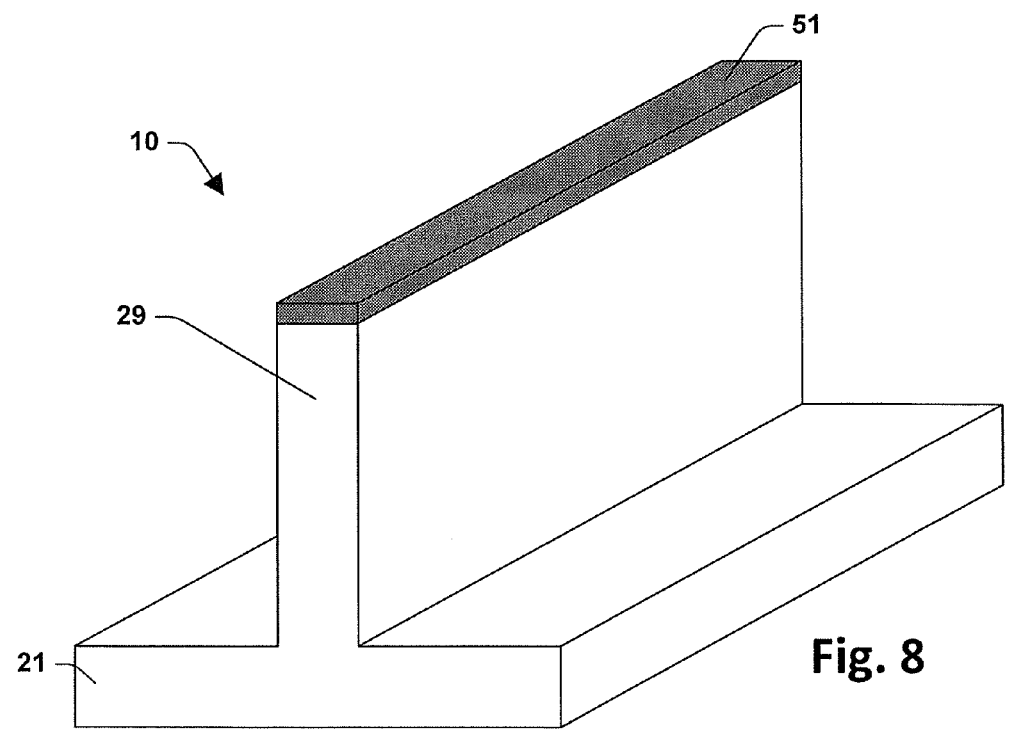
Figure 9:
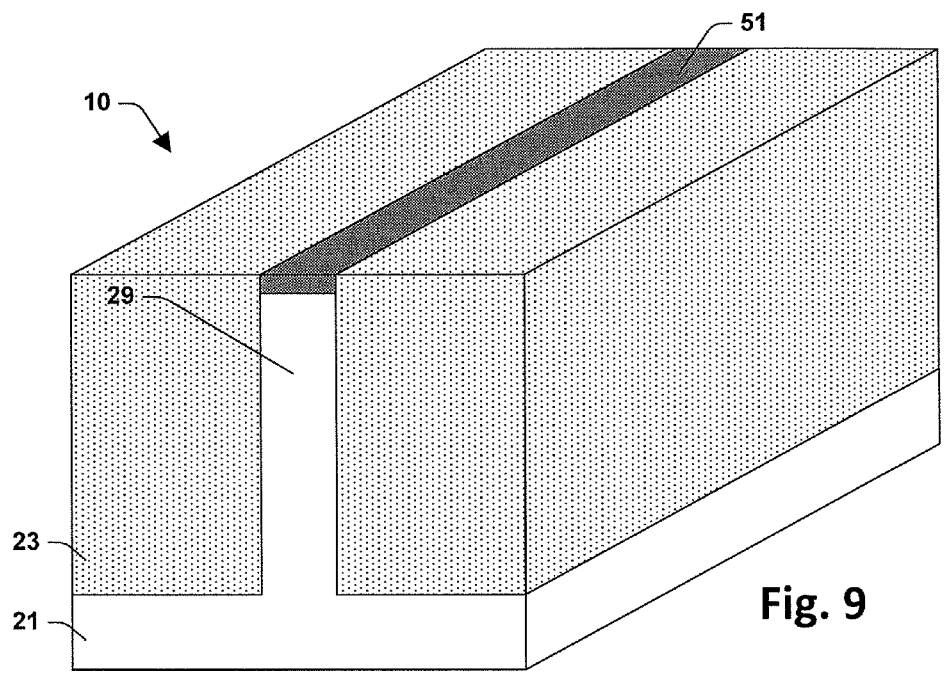

Act 112 forms a hard mask 51 over the semiconductor 21. Act 113 is patterning the mask 51 according to the desired locations and dimensions for fins 29. The resulting structure is illustrated by FIG. 7 according to one embodiment. Patterning can be accomplished by any suitable process, but typically includes photolithography and etching. Act 114 is etching the semiconductor 21 to form fins 29 to the pattern of the mask 51 as shown in FIG. 8. Act 115 deposits a layer of field oxide 23 over and around the fins 29. Act 116 planarizes the field oxide 23 to the height of the mask 51, whereby the fins 29 are encased within the field oxide 23 as shown in FIG. 9. Planarization can be accomplished by any suitable process. A planarization process is typically chemical-mechanical polishing (CMP).

Figure 6:
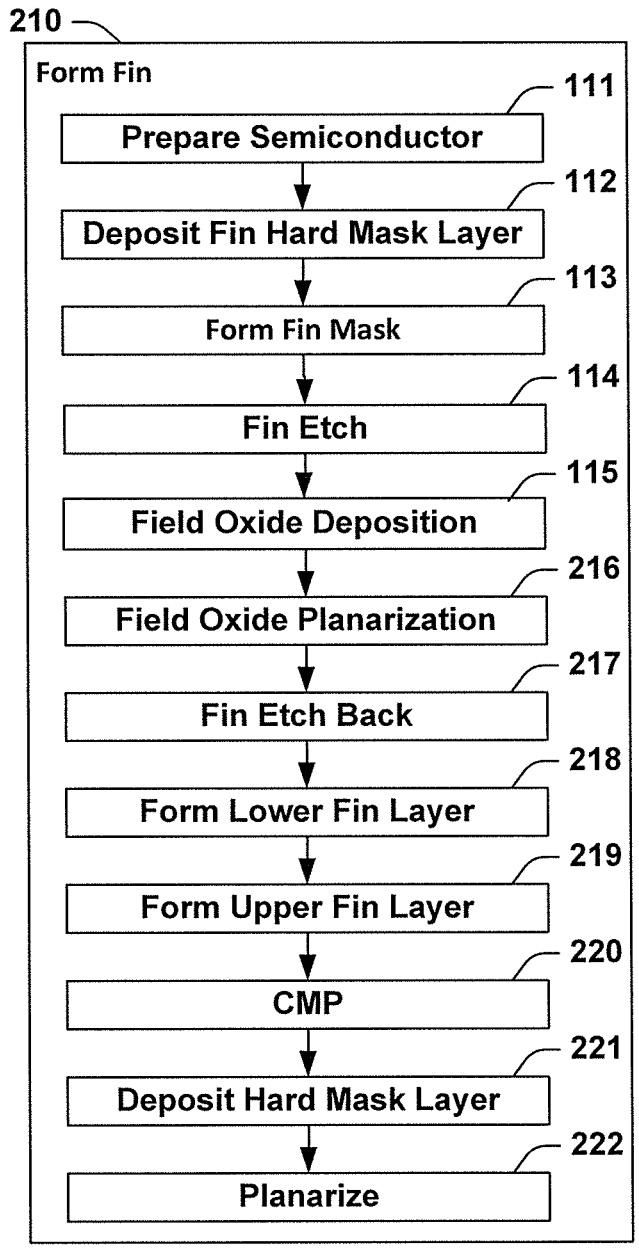
FIG. 6 is a flow chart of an alternate method of fin formation according to one embodiment provided by the present disclosure.

The process 110 can proceed directly with the series of acts 120, which form a mask 56 that covers an upper portion 44 of the fins 29. Alternatively, additional acts can be undertaken to provide fins 29 with multiple strata having differing compositions. FIG. 6 provides a flow chart for an alternate fin formation process 210 that provides fins 29 with multiple strata. The example process 210 is a HARP (high aspect ratio) epitaxial process in which an upper portion of the fins 29 is removed and replaced with materials of differing composition according to one embodiment.

Figure 10:
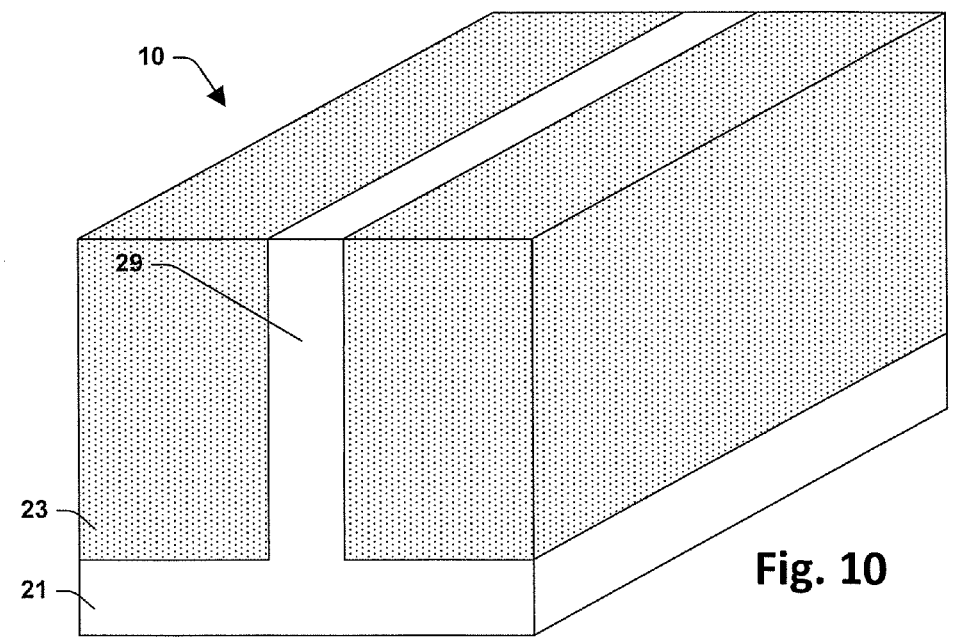
Figure 11:
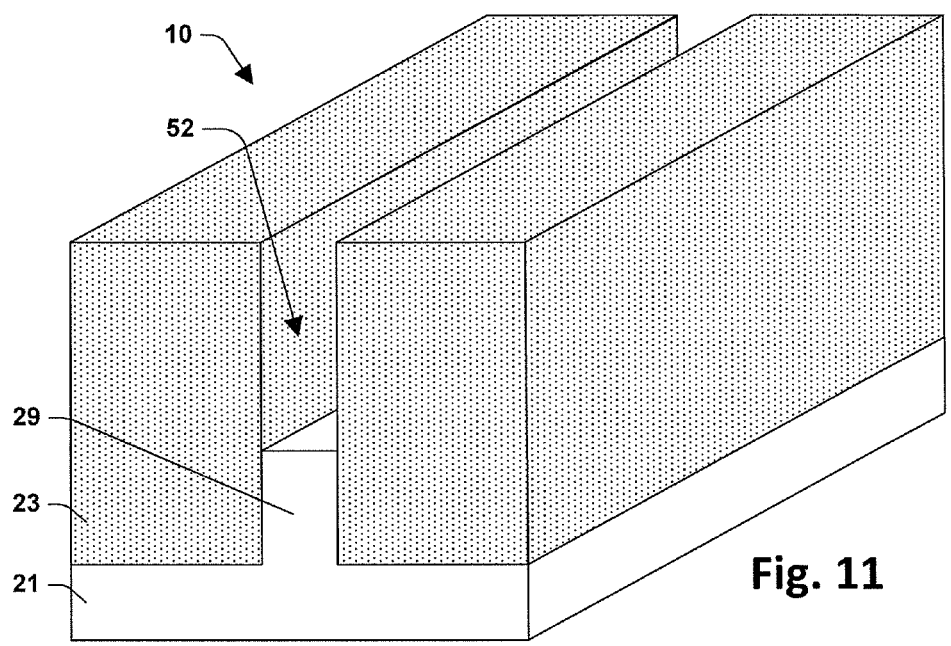

Process 210 of FIG. 6 begins to differ from process 110 with act 216, planarization. In the case of process 210, planarization 216 proceeds to the extent of removing the hard mask 51 to produce the structure shown in FIG. 10. Part of the fin 29 is then etched away in act 217 to lower the height fin 29 and provide a void 52 in the field oxide 23 as shown in FIG. 11.

Figure 12:
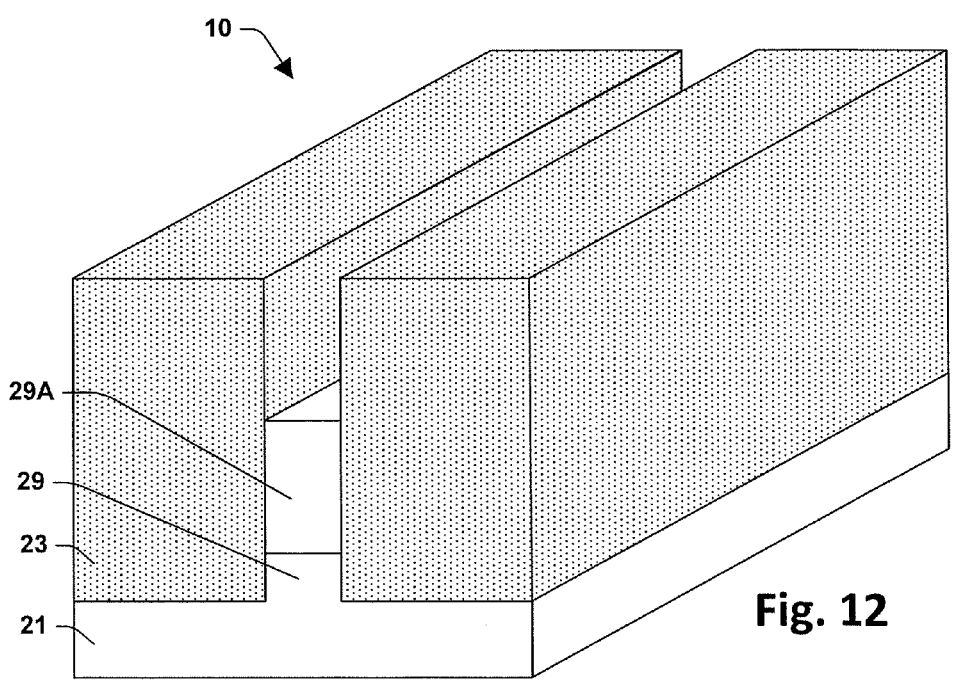
Figure 13:
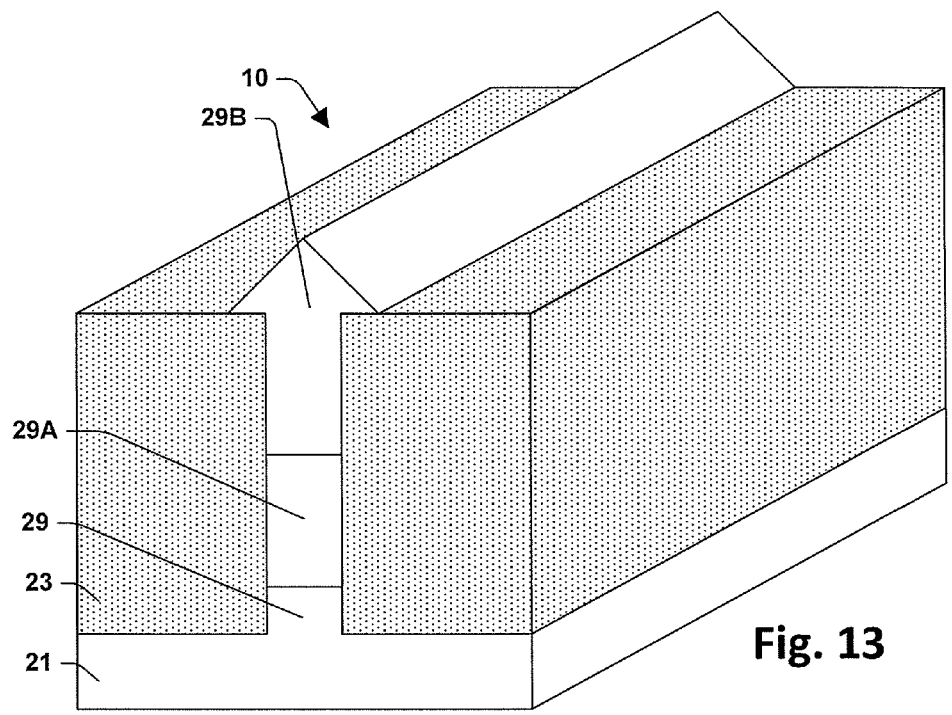

Act 218 forms a first layer 29A that approximately corresponds to the lower portion 46 of the fin 29. The resulting structure is illustrated by FIG. 12. Act 219 forms a second layer 29B that approximately corresponds to the upper portion 44 of the fin 29. The resulting structure is illustrated by FIG. 13. The layers 29A and 29B can be formed by any suitable process, but are generally formed by epitaxial growth to provide continuity in the crystal structure of the fin 29.

The layer 29A is formed to a different composition from that of the semiconductor 21 and the upper layer 29B. The composition can be selected to facilitate swelling. In some embodiments, the composition of the layer 29A is selected to have a higher oxidation rate than that of the upper layer 29B to allow oxidation to be carried out at a comparatively lower temperature. For example the layer 29A can be SiGe while the upper layer 29B is Si. SiGe oxidizes more than 10 times faster than Si. In some embodiments, the composition of the layer 29A is selected to have a higher oxidation rate than the semiconductor 21. The compositions can be separately determined for n-type and p-type FinFETS. nMOS regions of the semiconductor 21 can be masked while one or both the layers 29A and 29B are grown in pMOS regions of the semiconductor 21 and vice versa.

Figure 14:
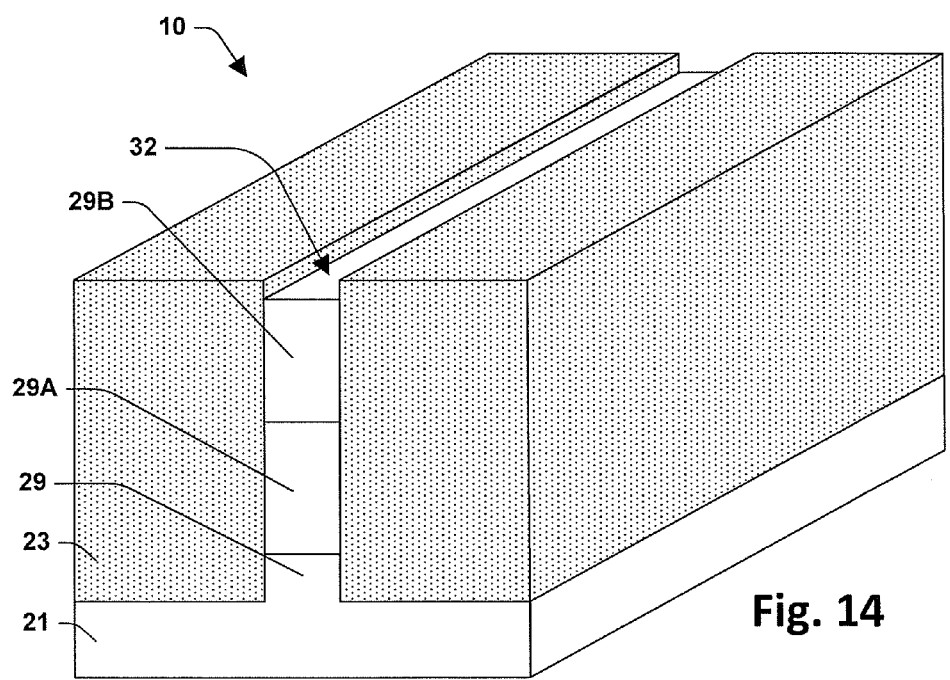
Figure 15:
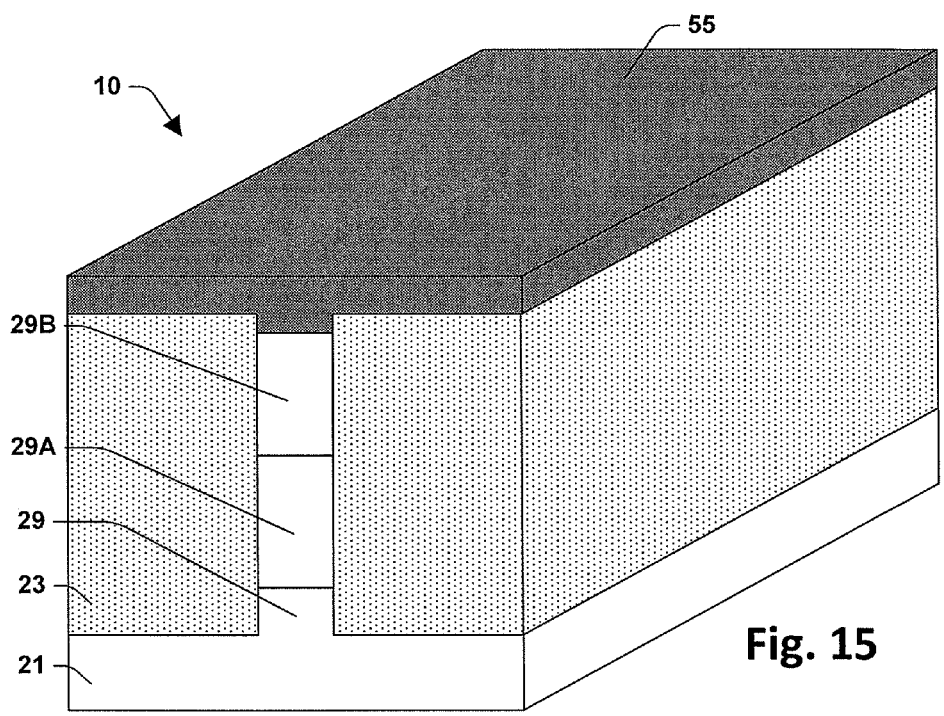
Figure 16:
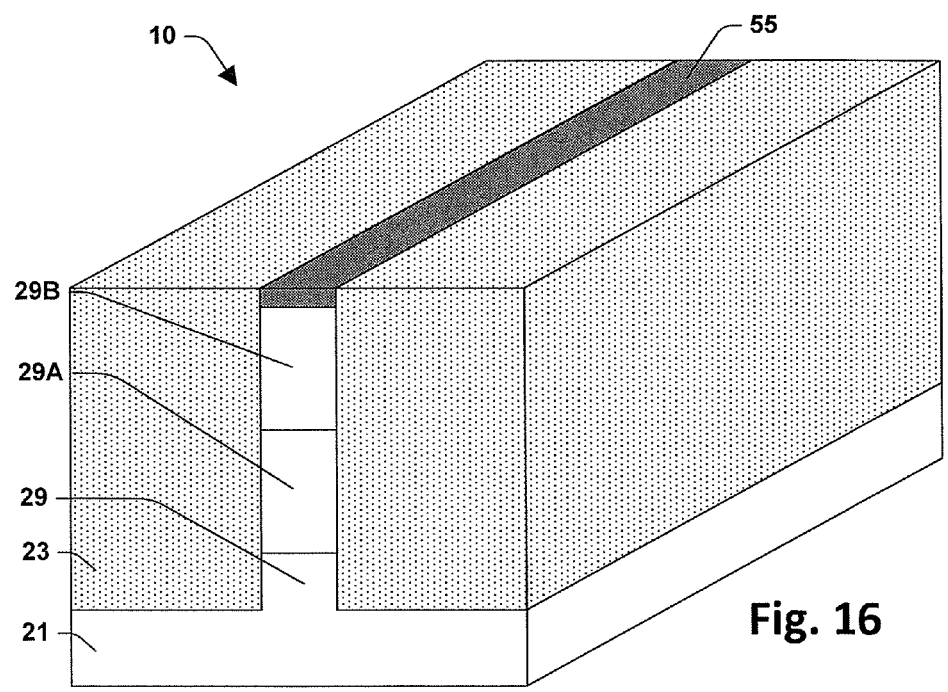

The process 210 continues with act 220, planarizing such as chemical mechanical polishing. After CMP, an etch process can be used to form the recess 32 shown in FIG. 14. A hard mask layer 55 as shown in FIG. 15 is then formed with act 221 followed by act 222, planarization to remove the hard mask layer 55 except where it fills the recess 32. The resulting structure, shown in FIG. 16, is essentially the same as the structure shown in FIG. 9 except for the difference in composition of the fin 29.

Figure 17:
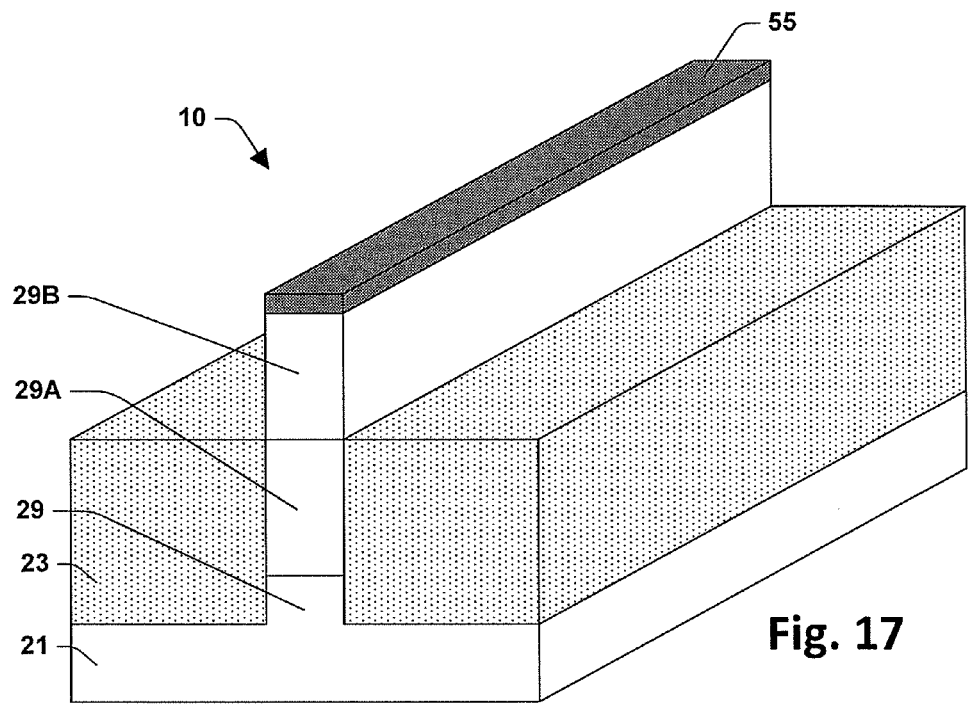
Figure 18:
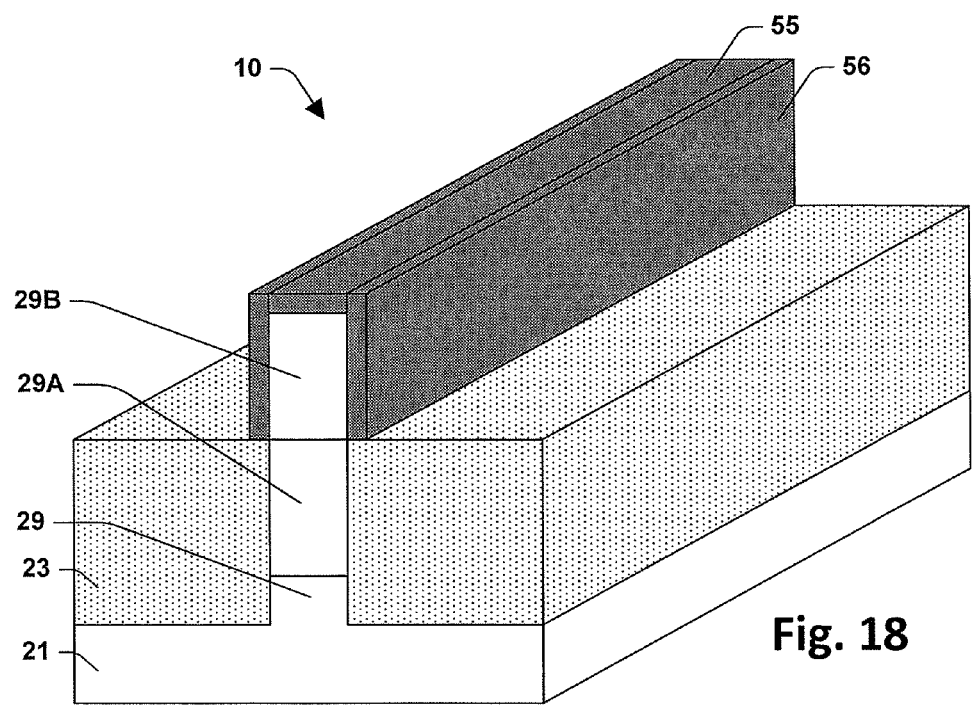

The process 100 of FIG. 5 continues with a series of acts 120 that form a mask over the upper portion 44 of the fin 29. Act 121 is an etch that recesses the field oxide 23 to expose the upper portion 44 of the fin 29 while leaving the field oxide 23 at the height of the lower portion 46 of the fin 29. Where the fin 29 has a stratified composition, the field oxide 23 is recessed to approximately the same height as the juncture between the layers 29A and 29B as illustrated in FIG. 17. Act 122 then forms a mask 56 covering the sides of the upper portion 44 of the fin 29 as show in FIG. 18. The mask 56 can be formed by any suitable process. A suitable process can be one otherwise used to form spacers, for example a blanket deposition of the spacer material followed by anisotropic etching. The mask 56 can have any suitable composition, but is typically a nitride, SiON for example.

Figure 19:
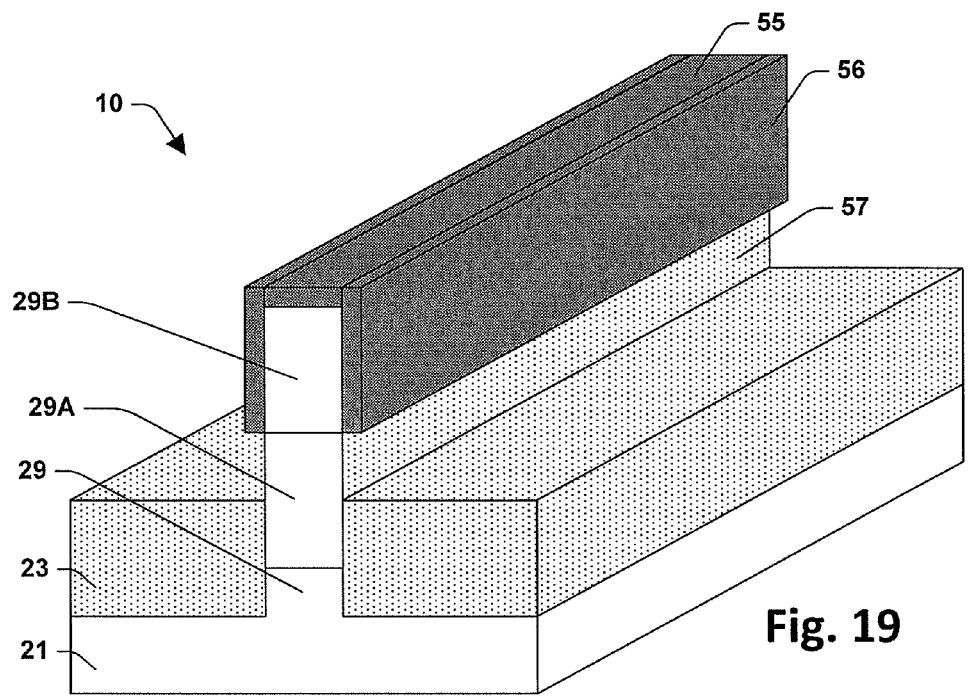

After forming the mask 56, act 123 further recesses the field oxide 23 to expose the lower portion 46 of the fin 29 as shown in FIG. 19. Act 124 forms a thin oxide layer 57 over the exposed portions of the fin 29, which is also shown in FIG. 19. Thin oxide layer 57 protects the fin 29, such as by providing an etch stop layer for when a dummy gate is later removed in a gate replacement process. The oxide layer 57 is too thin to cause significant strain in the channel region 45 of the fin 29.

Figure 20:
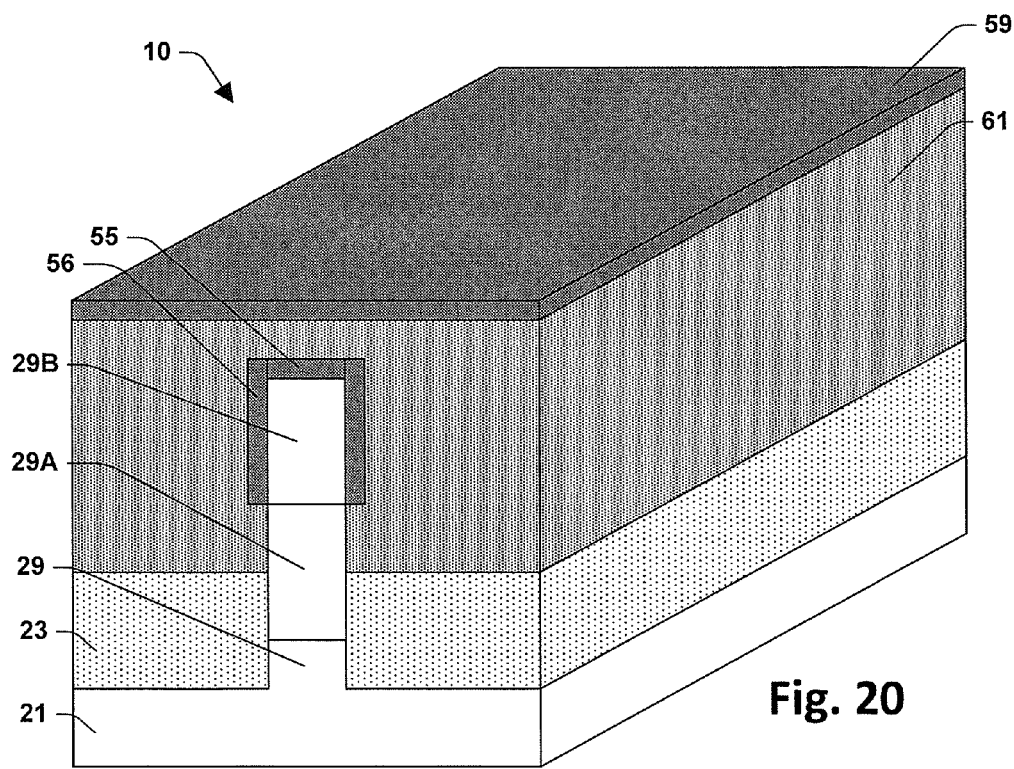
Figure 21:
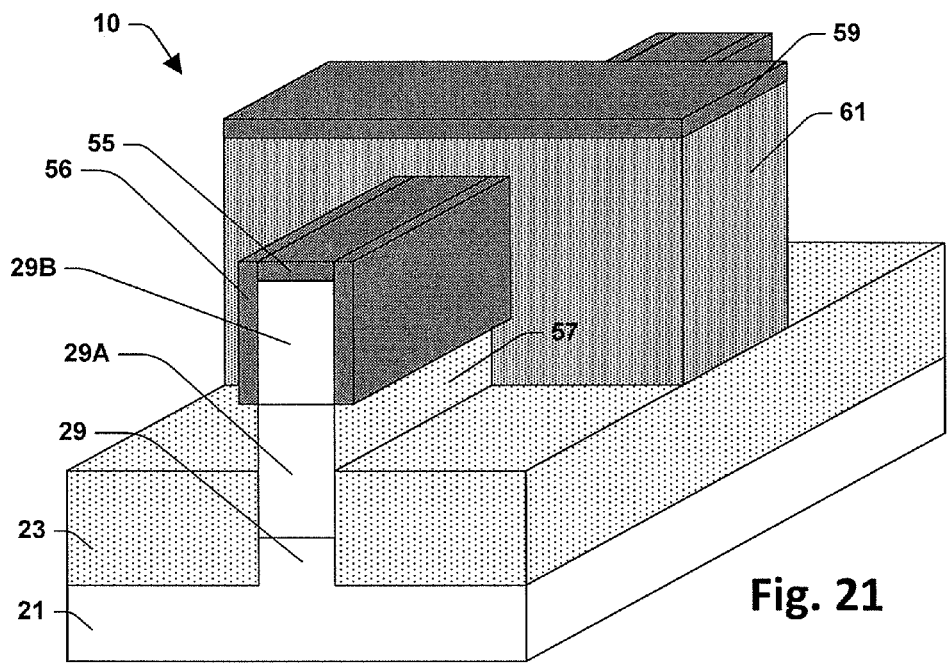

The process 100 continues with a series of acts 130 that form a dummy gate 61 over the channel region 45 of the fin 29. Act 131 is forming a dummy gate stack. The dummy gate stack includes sacrificial material and optionally one or more additional layers. The additional layers can include interfacial layers, etch stop layers, and or dielectric layers. If n-type FinFETs 20 with strain-inducing expanded material 25 are not required, the dummy gate 61 can be a functional gate 42 or include one or more layers that will form part of the functional gate 42, such as the dielectric layer 43. The sacrificial material is typically polysilicon, but any suitable material can be used. Act 132 planarizes the dummy gate stack 61 and act 133 forms a mask layer 59 over the dummy gate stack 61 to provide the structure shown in FIG. 20. Act 134 patterns the dummy gate stack 61 to form the structure shown in FIG. 21.

Figure 22:
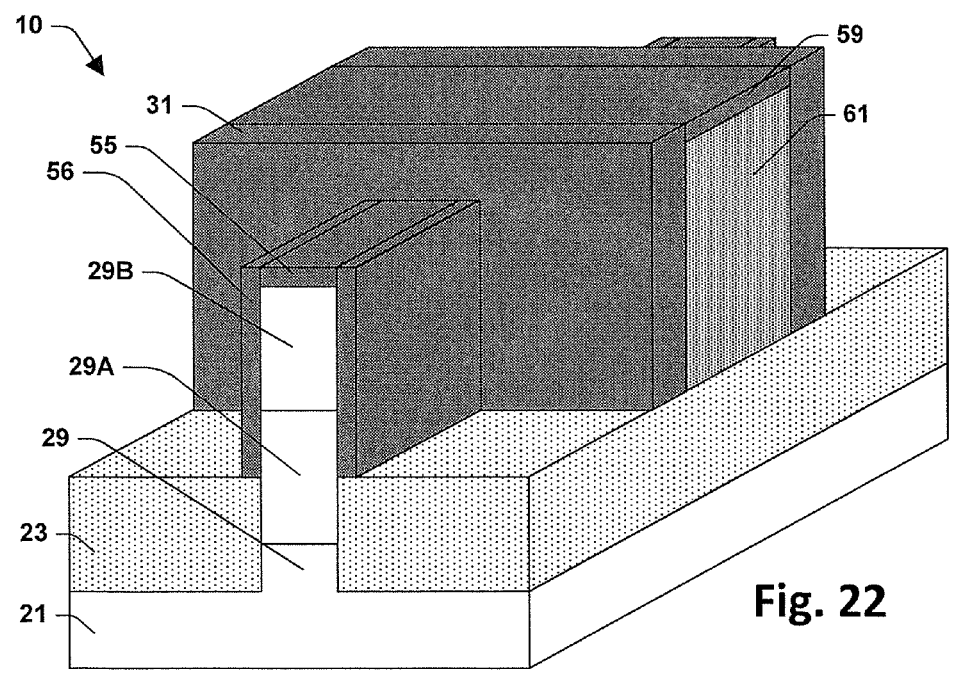

Act 134 forms spacers 31 as shown in FIG. 22. Any suitable spacer formation process can be used. The spacer material also deposits on the sides of fin 29 in source areas 33 and the drain areas 39. FIG. 22 shows this as an extension of the mask 56, although the mask 56 and the spacers 31 could be formed from different materials.

Figure 22A:
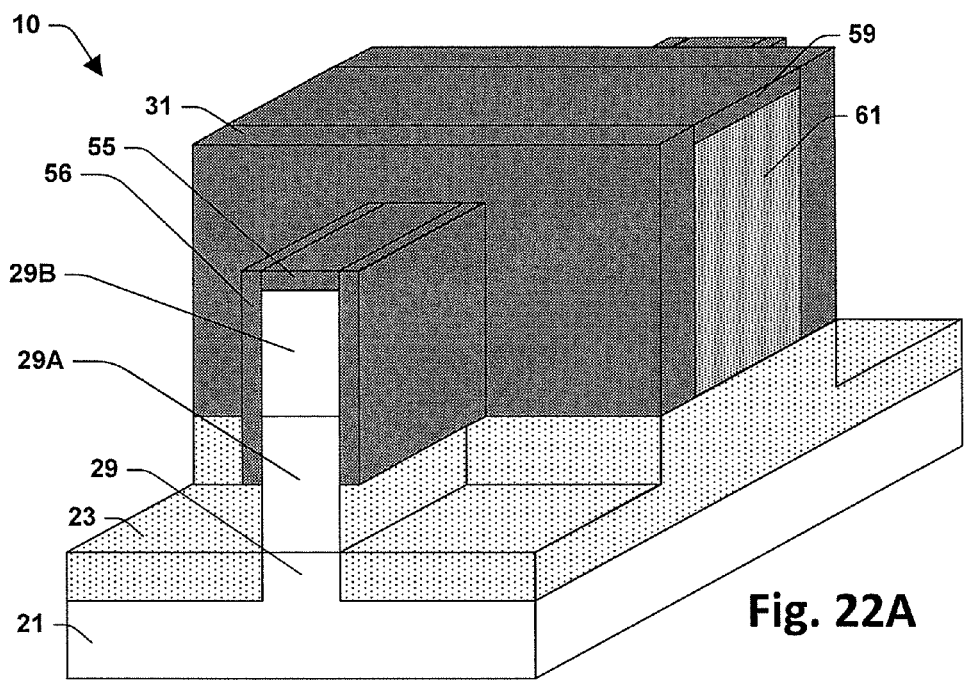

The process 100 of FIG. 5 continues with a series of acts 140 by which the swelled material 25 is formed under the source regions 33 and the drain regions 39 of the p-type FinFETs 10. Swelled material at these locations is not desired for the n-type FinFETs 20. Accordingly, act 141 is masking any nMOS regions of the semiconductor 21. Act 142 is a third oxide recess to expose the fin 29 below the area that is masked by the spacer material as shown in FIG. 22A. Act 142 can take place before act 141 if this further oxide recess is desired for the n-type FinFETs 20. Act 143 converts exposed material of the fin 29 into swelled material 25 via oxidation. The channel area 45 of fin 29 is masked by dummy gate 61 and spacers 45. The upper portion 44 of the fin 29 is protected by masks 55 and 56. The swelled material 25 forms only in the lower portion 46 of the fin 29 and only under the source regions 33 and the drain regions 39 of the fin 29.

Figure 23:
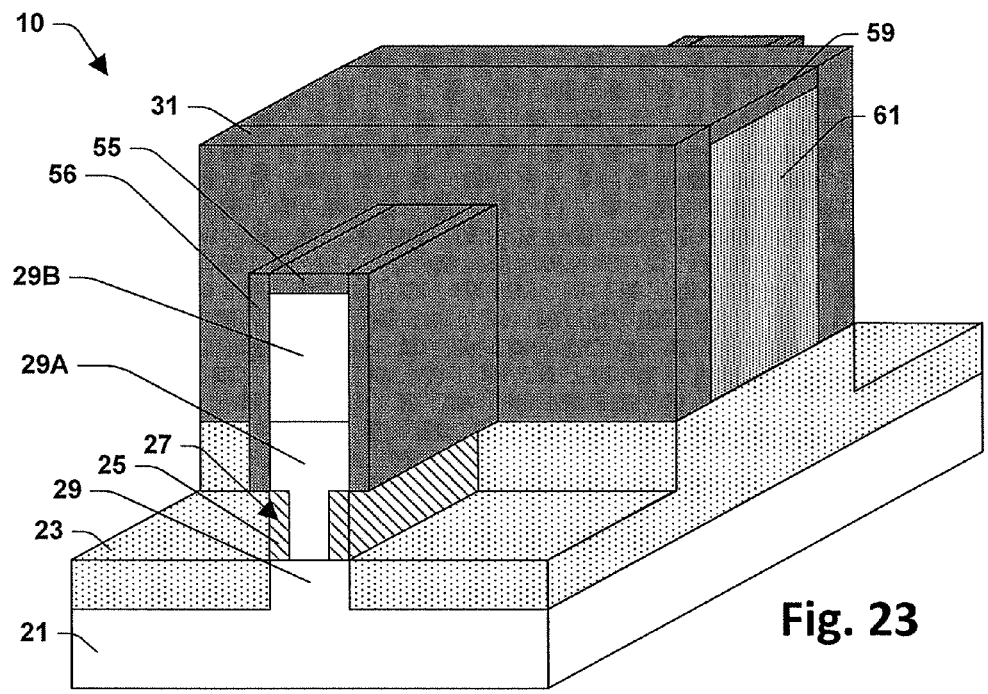

Act 143 is oxidation that converts semiconductor of the fin 29 to an oxidized form, which is the swelled material 25 as shown in FIG. 23. The swelled material 25 has greater volume than its reduced state. The expansion of this material within the body of fin 29 creates stresses and strain. Oxidation progresses through an appreciable portion of the thickness of the fin 29. The regions 27 of the fin 29 in which the swelled material 25 forms generally penetrate at least 15% of the thickness of the fin 29 in order to provide an appreciable strain in the channel region 45. The regions 27 can be viewed as hollows in the semiconductor of the fin 29, hollows that are overhung by upper portions of the fin 29 and that are filled with swelled (oxide) material. In one embodiment, oxidation proceeds through the full thickness of the fin 29, whereby the regions 27 on either side of the fin 29 meet, completely undercutting the source region 33 and the drain region 39 of the fin 29. In another embodiment, however, oxidation proceeds less than 100% of the way through the thickness whereby the upper portion 44 of the fin 29 remains rigidly connected to the semiconductor 21 underneath through the entire lengths of the source region 33 and the drain region 39. The height of the regions 27 is generally in the range from 5 nm to 10 nm.

Figure 24:
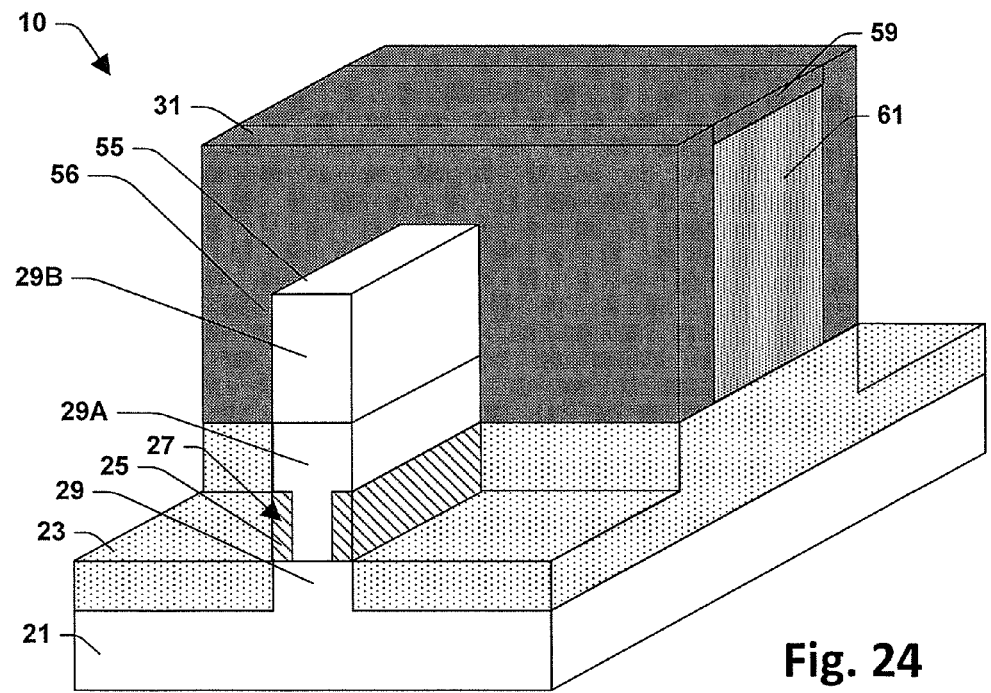
Figure 25:
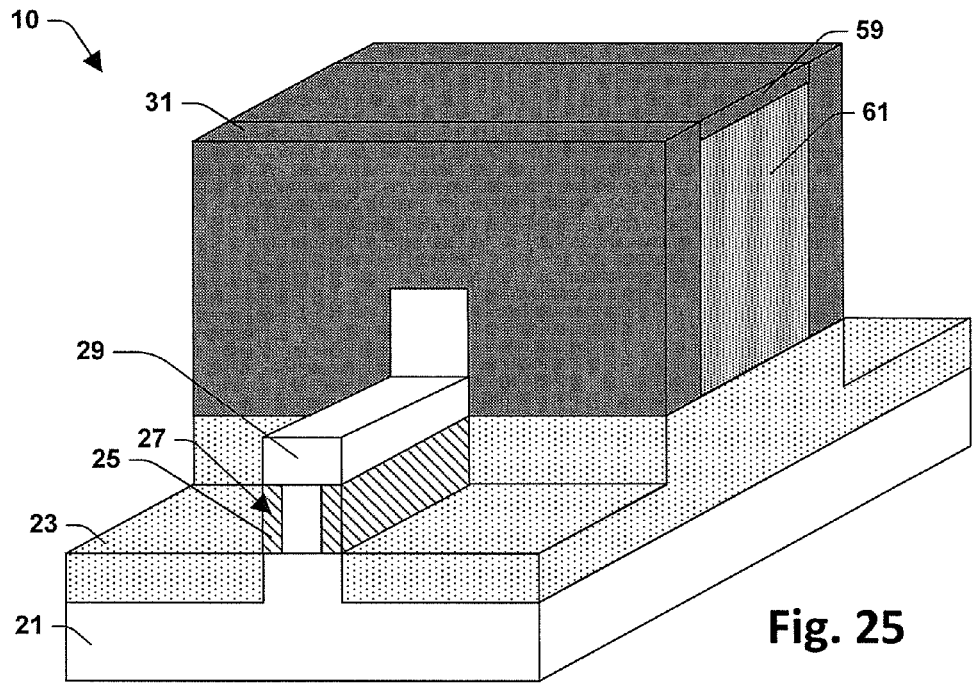

The process 100 continues with a series of acts 150 that increase the area available for source and drain contacts through epitaxial growth. Act 151 removes the hard mask 55 and 56 from the source region 33 and the drain region 39 of the fin 29 as shown in FIG. 24. Acts 151 and 152 can be combined in a single etch step that removes both nitride caps and some of the source and drain semiconductor. Some semiconductor material is left above the swollen regions 25 produced by oxidation Act 152 creates recesses 65 within the fin 29 in the source region 33 and the drain region 39 as shown in FIG. 25. Act 152 generally leaves the upper fin 44 with at least 10 nm thickness remaining.

Figure 26:
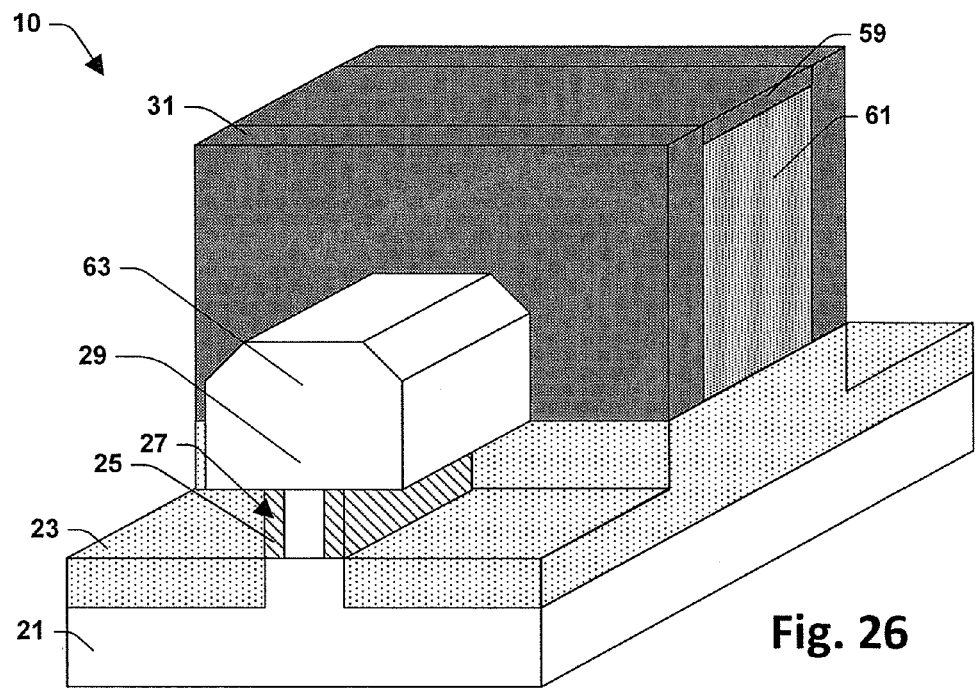

Act 153 is epitaxial growth of a semiconductor 63 on the source regions 33 and the drain regions 39 of p-type FinFETs 10 to provide a structure as shown in FIG. 26. Where the recesses 65 have been formed, the semiconductors 63 is generally selected to have a larger lattice constant than the semiconductor of the channel region 45. For example, when the channel region 45 is silicon, the semiconductor 63 could be SiGe.

Act 154 is epitaxial growth of a semiconductor 63 on the source region 33 and the drain region 39 of n-type FinFETs 20. Where the recesses 65 have been formed, the semiconductors 63 for the nMOS regions is generally selected to have a smaller lattice constant than the semiconductor of the channel region 45. For example, when the channel region is silicon, the semiconductor 63 could be SiP or SiC for the nMOS regions. Where epitaxial growth in the source regions 33 and the drain regions 39 is not used to create additional stress in the channel regions 45, acts 153 and 154 can be combined.

Figure 27:
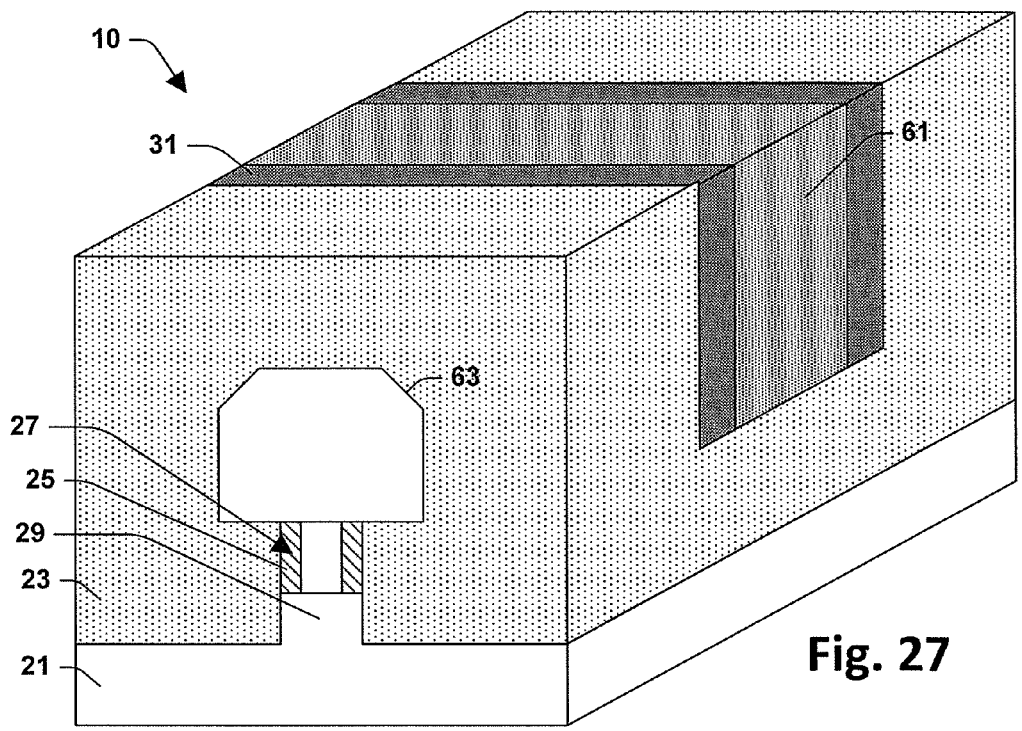

Act 155 deposits additional field oxide 23. Act 157 planarizes the oxide to produce a structure as shown in FIG. 27. The additional field oxide 23 provides a level surface for forming mask layers in subsequent steps.

Figure 28:
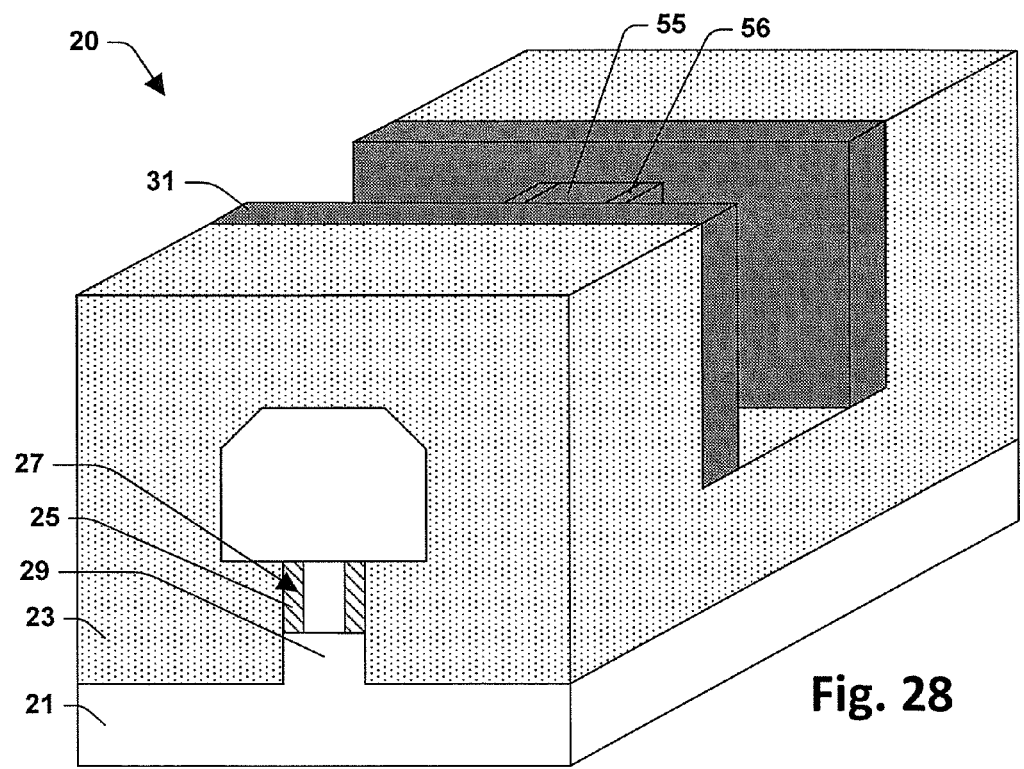
Figure 29:
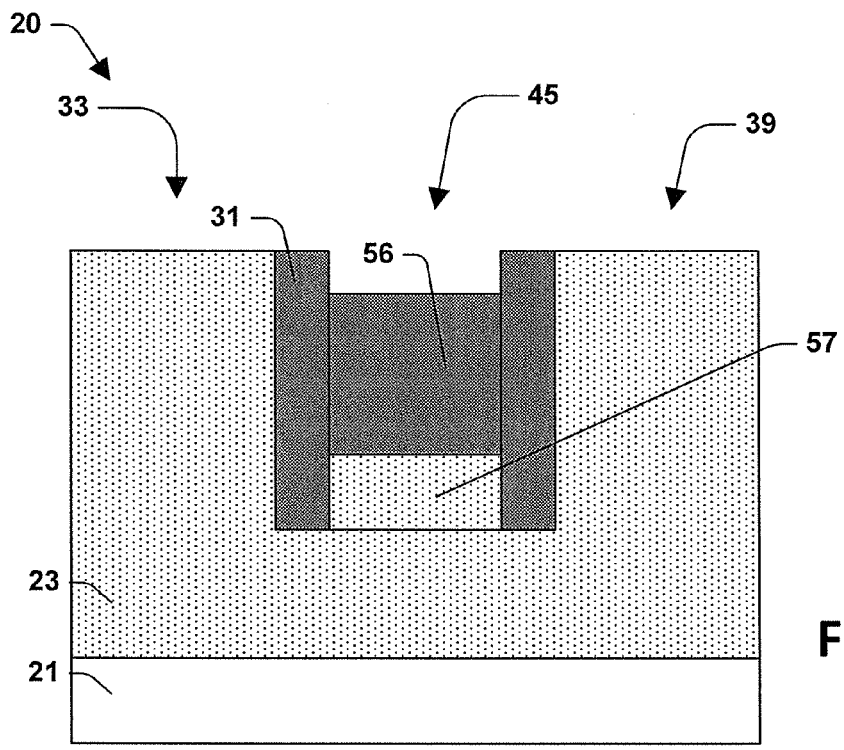

The process 100 continues with a series of acts 160 by which the swelled material 25 is formed under the channel regions 45 of the n-type FinFETs 20. Swelled material at these locations is not desired for the p-type FinFETs 10. Accordingly, act 161 is masking any pMOS regions of the semiconductor 21. Act 162 removes the dummy gate stack 61 in the nMOS regions to produce a structure as shown in FIG. 28. FIG. 29 is a side view of this same structure.

Figure 30:
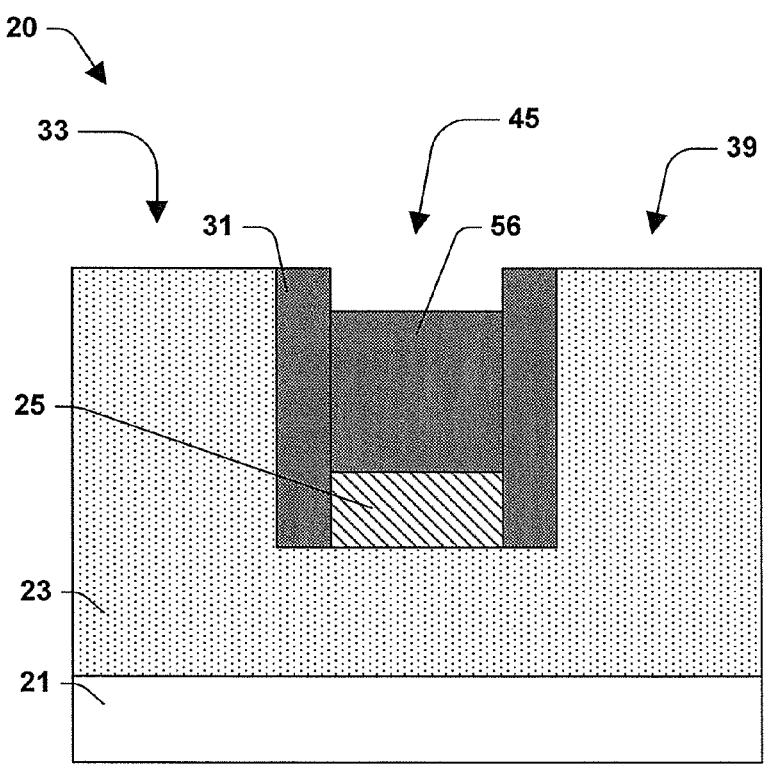

Act 163 converts exposed material of the fin 29 into swelled material 25 via oxidation. For act 163, the source regions 33 and the drain regions 39 of fin 29 are masked by field oxide 23 and spacers 45. The upper portion 44 of the fin 29 is protected by masks 55 and 56. The swelled material 25 forms only in the lower portion 46 of the fin 29 and only under the channel region 45. The resulting structure is shown in FIG. 30. The comments concerning the thickness and height of the regions 27 are the same as for the pMOS areas, although the particular values for these parameters, particularly the thickness to which the swelled material 25 is formed, may be selected separately for the pMOS and nMOS areas.

Figure 31:
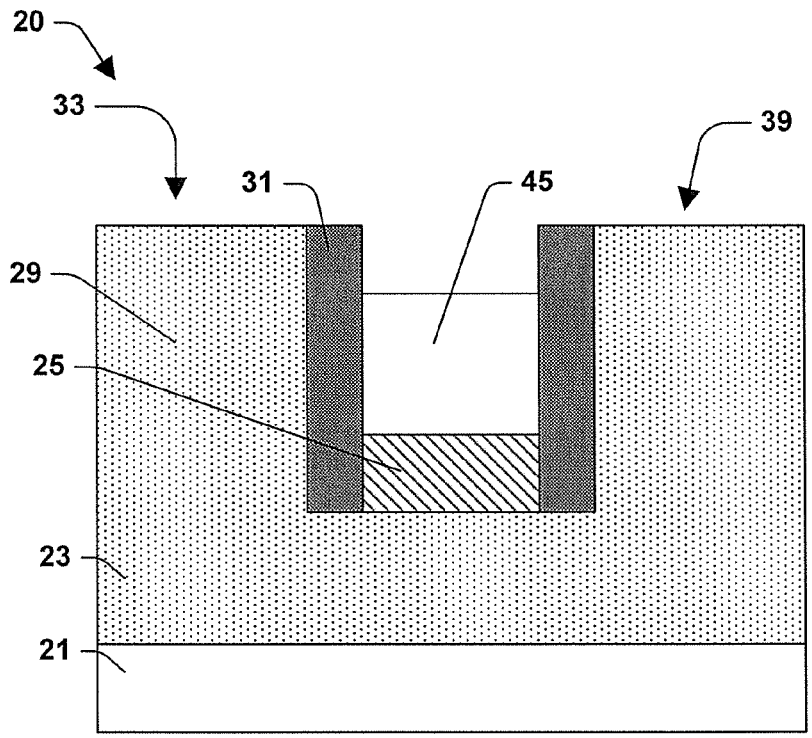
Figure 32:
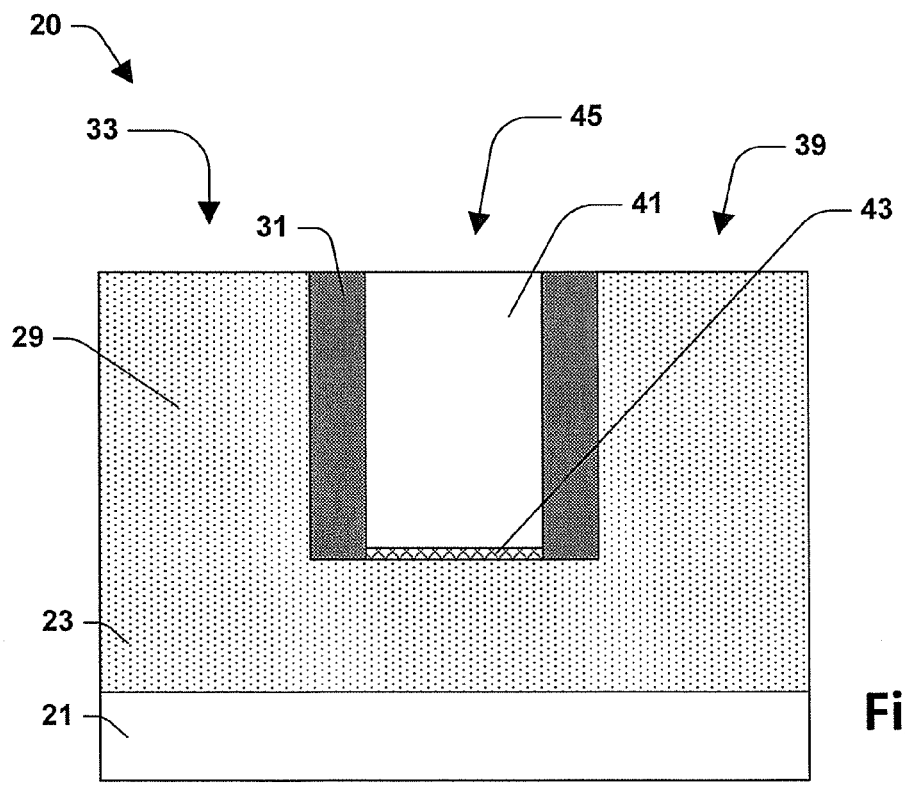

The process 100 continues with a series of acts 170 that complete the gate replacement process. Act 171 removes the masks 55 and 56 from the channel region 45 of the n-type FinFETs 20 as shown in FIG. 31. The replacement gate is then formed to produce the structure shown in FIG. 32. This is the same structure as shown by FIG. 3 in a perspective view. The view of FIG. 3 omits an upper portion of the field oxide 23 or the epitaxial grown semiconductor 63 to provide a better view of the underlying structures. The structure of FIG. 1 is also arrived at following act 173. It should be understood that additional processing generally occurs before, during, and after the illustrated actions of the process 100 to complete the device formation.

Computer simulations and experiments show that the FinFETs 10 produced by the process 100 can exhibit stresses of 2 GPa in the channel region 45 resulting in a 4% linear deformation. Stresses above 0.95 GPa could not be achieved without the swelled material 25. In most embodiment of the present disclosure, the stress is greater than 1.0 GPa. In some embodiment of the present disclosure, the stress is greater than 2.0 GPa.

The field oxide 23 can be formed from any suitable dielectric and can include multiple layers of different dielectrics. A suitable dielectric for field oxide 23 can be, for example, silicon oxide derived from tetraethyl orthosilicate (TEOS) or silane. In some embodiments, the field oxide 23 is a low-k dielectric material. Examples of low-k dielectric materials include fluorinated silicon oxide, siloxane SOG (spin-on glass), and polyimides.

The dielectric layer 43 can be formed of any suitable dielectric and can include multiple layers of different dielectrics. $SiO_2$ can be used. In some embodiments, the dielectric layer 43 is a high-k dielectric layer. A high-k dielectric is one having a conductivity at least 5 times that of silicon dioxide. Examples of high-k dielectrics include hafnium-based materials such as $HfO_2$, HfSiO, HfSiON, HfTaO, HfTiO, HfZrO, and $HfO_2$—$Al_2O_3$ alloy. Additional examples of high-k dielectrics include, without limitation, $ZrO_2$, $Ta_2O_5$, $Al_2O_3$, $Y_2O_3$, $La_2O_3$, and $SrTiO_3$.

The conductive layer 41 can also be made up of any suitable material and can include multiple layers of different materials. In some embodiments, particularly those in which a high-k dielectric is used, the conductive layer 41 is one or more metal layers. A metal layer 41 generally includes at least one layer of Ti, TiN, TaN, Ta, TaC, TaSiN, W, WN, MoN, and MoON. Additional examples of materials for conductive metal layers include ruthenium, palladium, platinum, cobalt, nickel, hafnium, zirconium, titanium, tantalum, aluminum, and conductive carbides, oxides, and alloys of these metals.

An integrated circuit device is disclosed in which a swelled material, typically an oxide, is formed underneath the source region 33 and the drain region 39 of a p-type FinFET 10. The device employs the swelled material to be disposed in such a way and swelled to such an extent that it stresses the channel region to the extent of causing a significant increase charge carrier mobility within the channel 45.

An integrated circuit device in which the swelled material is formed underneath the channel region 45 of an n-type FinFET 20 is disclosed. The device employs the swelled material in such a way and swelled to such an extent that it stresses the channel region to the extent of causing a significant increase charge carrier mobility within the channel 45.

A process by which an integrated circuit according to either above embodiment is disclosed. An upper portion 44 of a fin 29 is masked. A lower portion 46 of the fin 29 is also masked, but only along a portion of the fin length so as to leave the lower portion 46 exposed in some areas. The fin 29 is then oxidized where it is exposed, the oxidation causing a portion 25 of the material within the fin 29 to expand and exert stress on surrounding areas, including the channel region 45 of the fin 29. The oxidation and expansion proceeds to a degree that causes strain within the channel 45, the amount of strain being sufficient to cause a significant increase in charge carrier mobility within the channel 45.

The invention as delineated by the following claims has been shown and/or described in terms of certain concepts, components, and features. While a particular component or feature may have been disclosed herein with respect to only one of several concepts or examples or in both broad and narrow terms, the components or features in their broad or narrow conceptions may be combined with one or more other components or features in their broad or narrow conceptions wherein such a combination would be recognized as logical by one of ordinary skill in the art. Also, this one specification may describe more than one invention and the following claims do not necessarily encompass every concept, aspect, embodiment, or example described herein.

The invention claimed is:

1. An integrated circuit device, comprising:
a p-type FinFET having a source, a drain, and a channel; and
swelled material underneath the source and drain, the swelled material causing compressive strain within the channel that significantly increases charge carrier mobility within the channel.

2. The device of claim 1, wherein:
the FinFET comprises a semiconductor fin; and
the swelled material is an oxidized form of a first semiconductor material forming part of the fin.

3. The device of claim 2, wherein:
the channel comprises a second semiconductor material, the second semiconductor material having a composition distinct from the first semiconductor material.

4. The device of claim 3, wherein:
the second semiconductor material is silicon; and
the first semiconductor material is SiGe.

5. The device of claim 1, wherein
the FinFET comprises a semiconductor fin;
the fin is partially but not completely undercut in the source and drain regions, whereby a lower part of the fin has hollows on two opposite sides and portions of the fin overhanging the hollows; and
the swelled material occupies the hollows.

6. The device of claim 1, further comprising:
an n-type FinFET having a source, a drain, and a channel; and
swelled material underneath the channel of the n-type FinFET, the swelled material causing tensile strain within the channel that significantly increases charge carrier mobility within the n-type FinFET channel.

7. The device of claim 6, wherein
the n-type FinFET comprises a semiconductor fin;
the n-type FinFET fin is partially but not completely undercut in its channel region, whereby a lower part of the n-type FinFET fin has hollows on two opposite sides and portions of the n-type FinFET fin overhanging these hollows; and
the swelled material occupies the hollows of the n-type FinFET fin.

8. The device of claim 6, wherein
the n-type FinFET comprises a semiconductor fin;
the n-type FinFET fin is undercut in its channel region; and
the swelled material occupies the area where the n-type FinFET fin is undercut.

9. An integrated circuit device, comprising:
an n-type FinFET having a source, a drain, and a channel; and
swelled material underneath the channel, the swelled material causing tensile strain within the channel that significantly increases charge carrier mobility within the channel.

10. The device of claim 9, wherein
the FinFET comprises a semiconductor fin;
the fin is partially but not completely undercut in the channel, whereby the lower part of the fin has hollows on two opposite sides and portions of the fin overhanging the hollows; and
the swelled material occupies the hollows.

11. The device of claim 9, wherein:
the fin comprises first and second layers of distinct first and second semiconductor materials, respectively;
the channel comprises the first semiconductor material; and
the swelled material is an oxidized form of the second semiconductor material.

12. The device of claim 11, wherein:
the first semiconductor material is silicon; and
the second semiconductor material is SiGe.

13. An integrated circuit device, comprising:
a p-type FinFET having a p-type source, a p-type drain, and a n-type channel made of a first semiconductor material;
an n-type FinFET having a n-type source, a n-type drain, and a p-type channel made of the first semiconductor material; and
swelled material underneath the p-type source, the p-type drain, and the p-type channel, the swelled material causing compressive strain within the n-type channel and tensile strain within the p-type channel.

14. The device of claim 13, wherein the swelled material is an oxidized form of the first semiconductor material.

15. The device of claim 13, wherein the swelled material is an oxidized form of the second semiconductor material, the second semiconductor material having a composition distinct from the first semiconductor material.

16. The device of claim 15, wherein:
the first semiconductor material is silicon; and
the second semiconductor material is SiGe.

17. The device of claim 13, wherein
the p-type FinFET comprises a semiconductor fin;
the fin of the p-type FinFET is partially but not completely undercut in the p-type source and p-type drain regions, whereby a lower part of the fin of the p-type FinFET has hollows on two opposite sides and portions of the fin overhanging the hollows; and
the swelled material occupies the hollows.

18. The device of claim 13, wherein
the n-type FinFET comprises a semiconductor fin;
the fin of the n-type FinFET is partially but not completely undercut in the p-type channel, whereby the lower part of the fin of the n-type FinFET has hollows on two opposite sides and portions of the fin overhanging the hollows; and
the swelled material occupies the hollows of the n-type FinFET.

19. The device of claim 18, wherein
the p-type FinFET comprises a semiconductor fin;
the fin of the p-type FinFET is partially but not completely undercut in the p-type source and p-type drain regions, whereby a lower part of the fin of the p-type FinFET has hollows on two opposite sides and portions of the fin overhanging the hollows; and
the swelled material occupies the hollows of the p-type FinFET.

* * * * *